United States Patent
Abou-Khalil et al.

(10) Patent No.: US 8,634,174 B2
(45) Date of Patent: Jan. 21, 2014

(54) GATE DIELECTRIC BREAKDOWN PROTECTION DURING ESD EVENTS

(75) Inventors: Michel J. Abou-Khalil, Essex Junction, VT (US); James P. Di Sarro, Essex Junction, VT (US); Robert J. Gauthier, Jr., Hinesburg, VT (US); Junjun Li, Williston, VT (US); Souvick Mitra, Essex Junction, VT (US); Yang Yang, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 316 days.

(21) Appl. No.: 13/115,492

(22) Filed: May 25, 2011

(65) Prior Publication Data

US 2012/0300349 A1  Nov. 29, 2012

(51) Int. Cl.
*H02H 9/00* (2006.01)
*H02H 3/22* (2006.01)

(52) U.S. Cl.
USPC .............................. 361/56; 361/111

(58) Field of Classification Search
USPC .................................. 361/56, 111
See application file for complete search history.

(56) References Cited

U.S. PATENT DOCUMENTS

| | | | |
|---|---|---|---|
| 5,563,525 A | 10/1996 | Lee | |
| 5,610,790 A | 3/1997 | Staab et al. | |
| 5,646,808 A * | 7/1997 | Nakayama | 361/56 |
| 5,894,230 A | 4/1999 | Voldman | |
| 5,910,673 A | 6/1999 | Hsu et al. | |
| 5,953,601 A | 9/1999 | Shiue et al. | |
| 6,008,508 A | 12/1999 | Bergemont et al. | |
| 6,147,538 A | 11/2000 | Andresen et al. | |
| 6,310,379 B1 | 10/2001 | Andresen et al. | |
| 6,353,520 B1 | 3/2002 | Andresen et al. | |
| 6,359,465 B1 | 3/2002 | Hui | |
| 6,369,994 B1 | 4/2002 | Voldman | |
| 6,404,269 B1 | 6/2002 | Voldman | |
| 6,417,541 B1 | 7/2002 | Cai et al. | |
| 6,483,349 B2 | 11/2002 | Sakata et al. | |
| 6,541,824 B2 | 4/2003 | Lee et al. | |
| 6,747,501 B2 | 6/2004 | Ker et al. | |
| 7,002,397 B2 | 2/2006 | Kubo et al. | |
| 7,307,822 B2 | 12/2007 | Kitagawa et al. | |
| 7,869,174 B2 * | 1/2011 | Tanaka et al. | 361/56 |
| 2007/0182444 A1 * | 8/2007 | Tanaka et al. | 326/21 |

OTHER PUBLICATIONS

Lee, et al., "Voltage Clamping Requirements for ESD Protection of Inputs in 90nm CMOS Technology", Electrical Overstress/Electrostatic Discharge Symposium, 2008. Issue Date: Sep. 7-11, 2008 pp. 50-58.

* cited by examiner

*Primary Examiner* — Jared Fureman
*Assistant Examiner* — Lucy Thomas
(74) *Attorney, Agent, or Firm* — Wood, Herron & Evans LLP; Anthony J. Canale (57) ABSTRACT

Protection circuits, design structures, and methods for isolating the gate and gate dielectric of a field-effect transistor from electrostatic discharge (ESD). A protection field-effect transistor is located between a protected field-effect transistor and a voltage rail. Under normal operating conditions, the protection field-effect transistor is saturated so that the protected field-effect transistor is coupled to the voltage rail. The protection field-effect transistor may be driven into a cutoff condition in response to an ESD event while the chip is unpowered, which increases the series resistance of an ESD current path between the gate of the protected field-effect transistor and the voltage rail. The voltage drop across the protection field-effect transistor may reduce the ESD stress on the gate dielectric of the protected field-effect transistor. Alternatively, the gate and source of an existing field-effect transistor are selectively coupled provide ESD isolation to the protected field-effect transistor.

14 Claims, 5 Drawing Sheets

GATE DIELECTRIC BREAKDOWN PROTECTION DURING ESD EVENTS

BACKGROUND

The present invention relates generally to semiconductor device fabrication and, more particularly, to circuits for protecting the gate dielectric of a field-effect transistor against electrostatic discharge (ESD) events, as well as methods for providing ESD protection and design structures for an ESD protection circuit.

Modern electronics achieve high levels of functionality in small form factors by integrating multiple functions onto a single chip. A common fabrication process that allows high levels of integration at a relatively low cost is Complementary Metal-Oxide-Semiconductor (CMOS). CMOS processes build a combination of p-type and n-type field effect transistors to implement logic gates and other types of digital and analog circuits.

Chips may be exposed to ESD events leading to potentially large and damaging currents and voltages within the integrated circuit. Increasing integration densities and performance demands on CMOS chips have resulted in reduced device dimensions. This reduction in dimensions has increased the susceptibility of integrated circuits to ESD events. Manufacturers, assemblers, and users of integrated circuits must take precautions to avoid unintentionally causing ESD events. For example, ESD prevention can be incorporated into the integrated circuit and may include special design techniques for input/output (I/O) pins and pads, as well as power supply pads. These special design techniques prevent damage to the chip both during handling after the chip is manufactured and while the chip is installed on a circuit board. Typically, this type of ESD protection operates by directing the current of an ESD event away from the internal circuits of the chip when the voltage on the protected pad exceeds a maximum allowable threshold.

One aspect of CMOS design where reduced device dimensions have increased susceptibility to ESD is the thickness of the gate dielectric of the field-effect transistors. A reduced gate dielectric layer thickness may result in a lower gate dielectric breakdown voltage, which reduces the ESD voltage that the field-effect transistor can withstand. This lower ESD voltage tolerance may reduce the ESD voltage design window between the normal operating and maximum allowable voltages on the I/O or supply pads of the chip.

Therefore, circuits that improve the breakdown resistance of the gate dielectric during ESD events, as well as methods and design structures for improving the breakdown resistance of the gate dielectric of a field-effect transistor during ESD events are needed.

BRIEF SUMMARY

In one embodiment, a circuit is provided for protecting an integrated circuit from an electrostatic discharge (ESD) event. The circuit includes a signal pad, a power pad, a first field-effect transistor, and a second field-effect transistor. The drain of the second field-effect transistor is coupled to the first field-effect transistor so that an ESD current path between the signal pad and the power pad passing through a gate of the first field-effect transistor passes through the drain of the second field-effect transistor. A trigger circuit is coupled with the signal pad and with the second field-effect transistor. In response to the ESD event at the signal pad while the integrated circuit is unpowered, the trigger circuit provides a first trigger signal to the second field-effect transistor. In response to the first trigger signal, the second field-effect transistor enters a cutoff condition so that the second field-effect transistor electrically isolates the first field-effect transistor from the second pad.

In another embodiment, a method of protecting an integrated circuit from an ESD event at the signal pad is provided that includes increasing the series resistance of an ESD current path passing from the signal pad to the power pad through a gate of the first field-effect transistor.

In another embodiment, a method of fabricating an ESD protection circuit is provided. The method includes forming a first field-effect transistor and a second field-effect transistor in a semiconductor substrate, and electrically coupling the drain of the second field-effect transistor to the first field effect transistor and the gate of the second field effect transistor to a trigger circuit. The method further includes forming a signal pad coupled to the first field-effect transistor by an interconnect structure, and forming a power pad coupled to a source of the second field-effect transistor by the interconnect structure.

In an embodiment of the invention, a hardware description language (HDL) design structure is encoded on a machine-readable data storage medium. The HDL design structure comprises elements that, when processed in a computer-aided design system, generates a machine-executable representation of a circuit for protecting an integrated circuit during an electrostatic discharge (ESD) event. The HDL design structure includes a first pad, a second pad, a first-field effect transistor including a gate, a second-field effect transistor including a drain coupled to the first field effect transistor, and a trigger circuit coupled with the first pad and with the second field-effect transistor. The first field-effect and second field effect transistors are configured so that an ESD current path between the first pad and the second pad passing through the gate of the first field-effect transistor also passes through the drain of the second field-effect transistor. In response to the ESD event and while the integrated circuit is unpowered, the trigger circuit is configured to drive the second field-effect transistor into a cut off mode so that the first field effect transistor is isolated from the second pad. The HDL design structure may comprise a netlist. The HDL design structure may also reside on storage medium as a data format used for the exchange of layout data of integrated circuits. The HDL design structure may reside in a programmable gate array.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Embodiments of the invention are related to an ESD protection circuit for a field-effect transistor, which may be fabricated using a metal-oxide-semiconductor process, on an integrated circuit, or chip. The ESD protection circuit includes a protection field-effect transistor coupled to a trigger circuit and to the protected field-effect transistor. During normal operation of the chip, the trigger circuit biases the gate of the protection field-effect transistor so that the protection field-effect transistor does not interfere significantly with the operation of the protected field-effect transistor. When the chip is unpowered (whether the chip is loose or is installed (e.g., surface mounted) on a printed circuit board), an ESD event may cause the trigger circuit to bias the protection field-effect transistor so that the protection field-effect transistor increases the series resistance of one or more ESD current paths through the gate of the protected field-effect transistor. The resulting voltage drop across the series resistance added by the protection field-effect transistor may reduce the portion of the total ESD voltage drop that appears across the gate dielectric layer of the protected field-effect transistor. The gate dielectric layer of the protected field-effect transistor is thereby subjected to a lower electric field strength from the ESD event than would be the case for a circuit lacking the protection field-effect transistor.

Figure 1A:
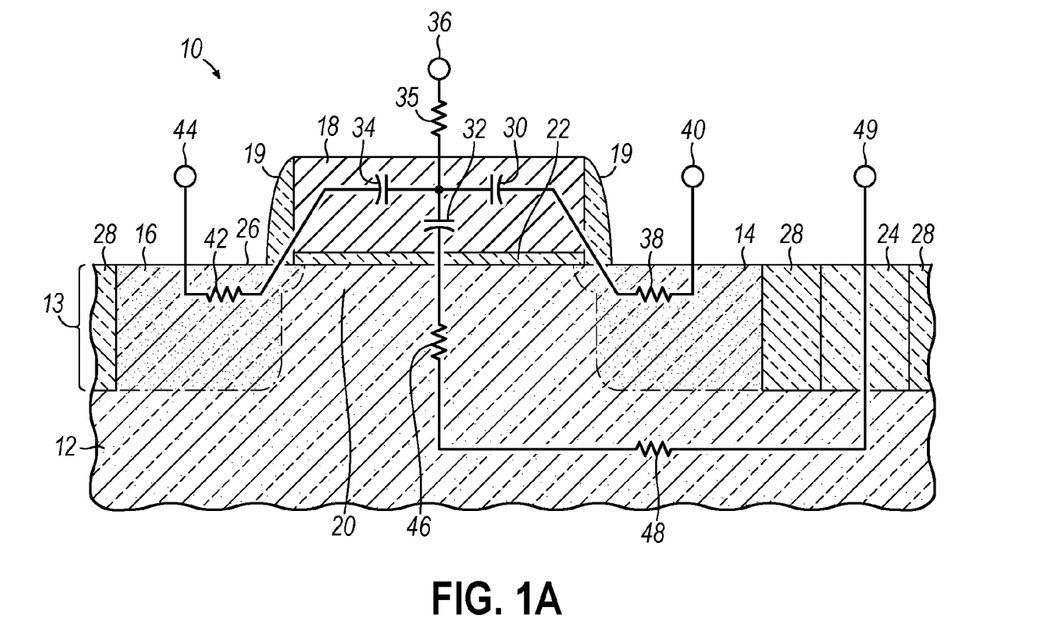
FIG. 1A is a diagrammatic cross-sectional view of a field-effect transistor.
Figure 1B:
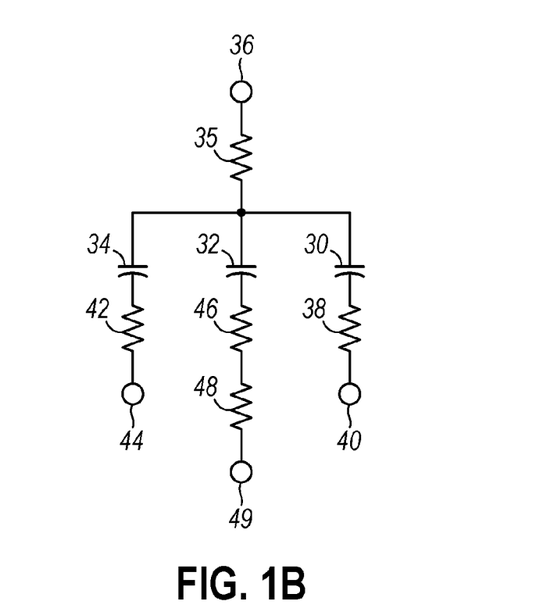
FIG. 1B is a schematic view of an electrical model illustrating the primary ESD current paths through the gate of the field-effect transistor in FIG. 1A.

With reference to FIGS. 1A and 1B, a field-effect transistor 10 is shown that is fabricated with a construction that may be used to fabricate the PFET 74 and NFET 75 described below. The field-effect transistor 10 is formed on a substrate 12. The field-effect transistor 10 may be formed in an active region 13 of substrate 12 and includes a drain 14, a source 16, and a gate 18. The gate 18 may be comprised of a conductive material, such as doped polycrystalline silicon or a metal, and is electrically isolated from the active region 13 of the substrate 12 by a gate dielectric layer 22. Spacers 19 may be formed on vertical surfaces of the gate 18 and may laterally separate the gate 18 from the drain 14 and the source 16 of field-effect transistor 10. The drain 14 and the source 16 of field-effect transistor 10 may be formed by doped semiconductor regions disposed laterally on opposite sides of the gate 18 and are connected laterally by a channel 20. The channel 20 may be comprised of a semiconductor having generally the same conductivity type as the active region 13 of substrate 12 and may be located generally below the gate 18. The channel 20 may electrically couple the drain 14 and the source 16 of field-effect transistor 10 when suitable voltages are applied to the gate 18. The field-effect transistor 10 may be either an n-channel field-effect transistor (NFET) or a p-channel field-effect transistor (PFET). If the field-effect transistor 10 is an NFET, the drain 14 and source 16 of field-effect transistor 10 may be an n-type semiconductor and the active region 13 may be a p-type semiconductor. If the field-effect transistor 10 is a PFET, the drain 14 and source 16 of field-effect transistor 10 may be a p-type semiconductor and the active region 13 may be an n-type semiconductor.

An active region body contact 24 may be formed by a region of semiconductor that intersects a top surface 26 of the substrate 12 and has the same conductivity type as the active region 13 of substrate 12. The body contact 24 may thereby provide an ohmic contact between the body of active region 13 and a body contact node 49. Dielectric regions 28 may be defined in the substrate 12 and may be configured to laterally isolate the field-effect transistor 10 from the body contact 24 as well as other adjacent devices (not shown). The substrate 12 may be a semiconductor-on-insulator (SOI) or bulk substrate comprised of a lightly-doped semiconductor material, such as p⁻ or n⁻ silicon, and is preferably monocrystalline or single-crystal material. Prior to formation of field-effect transistor 10, dopants may be selectively introduced into the substrate 12 using known methods to adjust the conductivity type of the active region 13, or well, in which field-effect transistor 10 is formed. Field-effect transistor 10 may thus have an active region 13 comprised of a p-type semiconductor, an n-type semiconductor, or an intrinsic semiconductor. NFETs and PFETs may thereby be fabricated on the same substrate 12 by selectively introducing an appropriate dopant into the active region 13 prior to formation of the associated MOSFET.

Referring now to FIG. 1B, the proximity of the gate 18 to the drain 14, source 16, and channel 20 of field-effect transistor 10 may result in capacitances across the gate dielectric layer 22 represented by a gate to drain capacitor ($C_{GD}$) 30, a gate to body capacitor ($C_{GB}$) 32, and a gate to source capacitor ($C_{GS}$) 34. A gate resistor ($R_G$) 35 connecting a gate contact node 36 to the capacitors 30, 32, 34 may be formed by the resistance to electrical current provided by the conductive material forming the gate 18 of field-effect transistor 10. Similarly, a drain resistor ($R_D$) 38 connecting capacitor ($C_{GD}$) 30 to a drain contact node 40, and a source resistor ($R_S$) 42 connecting capacitor ($C_{GS}$) 34 to a source contact node 44 may be formed by the resistance to electrical current provided by the semiconductor regions forming the drain 14 and source 16 of field-effect transistor 10, respectively. A channel resistor ($R_{CH}$) 46 may be formed by the resistance to electrical current provided by the semiconductor forming the channel 20. The channel resistor $R_{CH}$ may connect capacitor ($C_{GB}$) 32 to a body resistor ($R_B$) 48 formed by the resistance to electrical current provided by the active region semiconductor between the channel 20 and the body contact 24.

When used in an integrated circuit, one or more of the drain, source, or body contact nodes 40, 44, 49 of field-effect transistor 10 may be coupled to a power pad, voltage rail, or voltage node, such as $V_{DD}$, $V_{SS}$, or ground. As a result, the primary ESD current path through the gate 18 of field-effect transistor 10 will typically be through one or more of three primary ESD current paths formed between the gate contact node 36 of field-effect transistor 10 and the voltage rail coupled to one or more of the contact nodes 40, 44, 49. When an ESD event is incident on a pad coupled to the gate contact node 36, ESD currents may flow through one or more of these current paths to the associated voltage rail, placing stress on the gate dielectric layer 22. The total ESD voltage drop across the current path involved in the ESD event may be divided between: (1) the voltage drop across the gate capacitance, $C_{GD}$, $C_{GB}$, or $C_{GS}$ formed by the gate dielectric layer 22; and (2) the voltage drop across the series resistance(s), $R_D$, $R_{CH}$/$R_B$, or $R_S$. Increasing the series resistance electrically coupling the gate capacitor to the voltage rail for the ESD current path in question may increase the fraction of the total voltage drop that appears across the series resistance. The resulting reduction in the voltage drop across the gate dielectric layer 22 may limit the charge in-flow to the gate capacitor in question and increase the ESD voltage necessary to exceed the gate breakdown voltage of the field-effect transistor 10. Therefore, increasing $R_D$, $R_{CH}$, $R_B$, and/or $R_S$, or otherwise adding additional series resistance to one or more of the ESD current paths through the field-effect transistor 10, may improve the ability of the gate dielectric layer 22 to withstand ESD events without being damaged.

Figure 2:
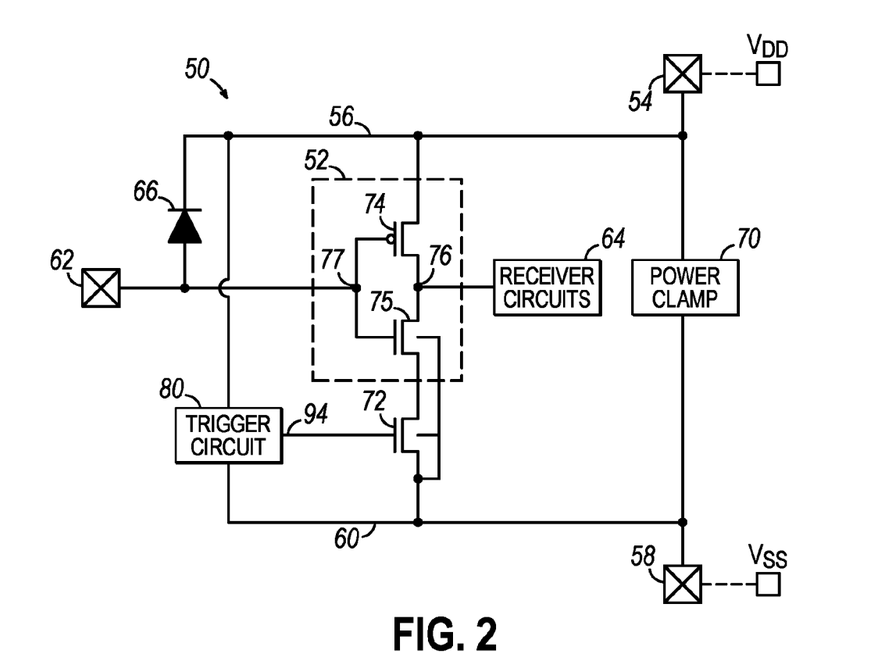
FIG. 2 is a schematic view illustrating the electrical configuration of an ESD protection circuit used to provide protection to an input buffer against positive voltage ESD events to an I/O signal pad coupled with an I/O pin in accordance with an embodiment of the invention.
Figure 3:
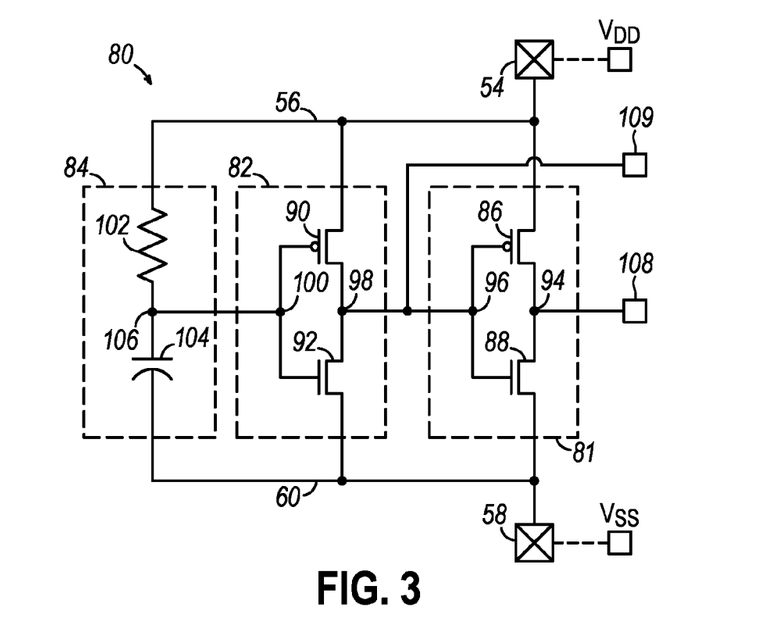
FIG. 3 is a schematic view illustrating a resistor-capacitor (RC) trigger circuit which supplies trigger signals to ESD protection circuits in accordance with an embodiment of the invention.

With reference to FIGS. 2 and 3 and in accordance with an embodiment of the invention, an integrated circuit 50 includes a buffer circuit 52, a first power pad 54 coupled to a positive power supply rail 56, a second power pad 58 coupled to a negative power supply rail 60, an input/output (I/O) pad 62, receiver circuits 64, a positive ESD protection diode 66, a power clamp 70, a protection NFET 72, and a trigger circuit 80. The I/O pad 62 may be protected from positive voltage ESD events by the positive ESD protection diode 66. To this end, the anode of positive ESD protection diode 66 may be electrically couple to the I/O pad 62 and the cathode of protection diode may be coupled to the positive power supply rail 56. The power clamp 70 may be coupled to the positive and negative power supply rails 56, 60 to protect the integrated circuit 50 from ESD voltages appearing across the power supply rails 56, 60.

The buffer circuit 52, which may be an inverter, may include a PFET 74 and an NFET 75 that each have a construction as described above with regard to field-effect transistor 10. The drain 14 of PFET 74 may be coupled to the drain 14 of NFET 75, which forms a buffer circuit output 76. The gate 18 of PFET 74 may be coupled to the gate 18 of NFET 75, which forms a buffer circuit input 77. The buffer circuit input 77 may be coupled to the I/O pad 62 and the buffer circuit output 76 may be coupled to the receiver circuits 64 so that signals on the I/O pad 62 are provided to the receiver circuits 64 by the buffer circuit 52. The buffer circuit 52 may be coupled to the positive power supply rail 56 by the source 16 of PFET 74, and to the drain of the protection NFET 72 by the source 16 of NFET 75. The protection NFET 72 may have a source coupled to the negative power supply rail 60 and a gate coupled to the trigger circuit 80, which may be a resistor-capacitor (RC) trigger circuit.

The trigger circuit 80 (FIG. 3) may include first and second inverters 81, 82, and a resistor-capacitor (RC) circuit 84. The first inverter 81 may include a PFET 86 and an NFET 88, and the second inverter 82 may include a PFET 90 and an NFET 92. The drain of NFET 88 may be coupled to the drain of PFET 86, which forms a first output 94 of trigger circuit 80. The gate of PFET 86 may be coupled to the gate of NFET 88 to form an input 96 of first inverter 81. The second inverter 82 may be formed in a similar fashion by electrically coupling the drain of PFET 90 and the drain of NFET 92 to form a second output 98 of trigger circuit 80, and electrically coupling the gates of PFET 90 and NFET 92 to form an input 100 of the second inverter 82. The inverters 81, 82 may be serially connected by electrically coupling the second output 98 of trigger circuit 80 to the input 96 of the first inverter 81. The sources of PFETs 86, 90 may be coupled to the positive power supply rail 56, and the sources of NFETs 88, 92 may be coupled to the negative power supply rail 60.

RC circuit 84 may include a resistor 102 and a capacitor 104 connected in series, which forms a common node 106 that is coupled to the input 100 of the second inverter 82. The resistor 102 may electrically couple the RC node 106 to the positive power supply rail 56, and the capacitor 104 may electrically couple the RC node 106 to the negative power supply rail 60, so that the voltage at node 106 may have a delayed response to changes in the voltage of the positive power supply rail 56. The trigger circuit 80 may provide a first trigger signal 108 at the first output 94 of the trigger circuit 80, and a second trigger signal 109 at the second output 98 of the trigger circuit 80. The first output 94 of trigger circuit 80 may be coupled to the gate of protection NFET 72 so that the trigger signal 108 may drive the NFET 72 into saturation when the chip is connected to power, and drive the NFET 72 into a cut off condition during an ESD event.

The integrated circuit 50 may be fabricated as part of a CMOS or BiCMOS chip. As understood by a person having ordinary skill in the art of semiconductor fabrication, standard CMOS or BiCMOS fabrication processes may be employed using a suitable substrate, such as a bulk semiconductor substrate or a device layer of an SOI substrate. For example, the active regions may be formed in a substrate by masking, implanting dopants of suitable impurity species with suitable kinetic energies, and thermally activating the implanted dopants. Each field-effect transistor may be formed in one of the active regions of the substrate. A gate and a gate dielectric are formed by depositing a gate stack using known methods and patterning the gate stack using photolithography and RIE. The drain and source for each field-effect transistor may be formed by implanting a suitable n-type dopant such as P, As, Sb, or may be formed by implanting a suitable p-type dopant such as B, Al, Ga depending on the type of MOSFET being formed. The dopants may be introduced by ion implantation using the gate as a self-aligning mask and separate resist masks during n-type and p-type dopant implantations and activated by an annealing step. The construction of each of the field-effect transistors may be similar to the construction of field-effect transistor 10 (FIG. 1A).

Standard back-end-of-line (BEOL) processing may follow the formation of the semiconductor devices of integrated circuit 50 to form a BEOL interconnect structure. Each level of the BEOL interconnect structure may be fabricated by damascene processes, such as a dual damascene process in which a dielectric layer is deposited, vias and trenches are etched in the dielectric layer, and the vias and trenches are filled with a conductor using a single blanket deposition followed by planarization. The damascene process may be replicated to stack multiple wiring levels so that a multi-level, high density framework of conductive interconnections is formed. Damascene processes and materials used in damascene processes are understood by a person having ordinary skill in the art.

The BEOL interconnect structure may include one or more lower dielectric layers containing metallization that supplies local interconnect wiring, and one or more upper dielectric layers containing metallization for levels of interconnect wiring. The metallization may define a wiring path forming a signal path coupling the I/O pad 62 with the local interconnect wiring of the ESD protection diodes 66 and the input 77 of the buffer circuit 52. The metallization may define a wiring path coupling the first power pad 54 with the local interconnect wiring for the positive power supply rail 56, which couples the cathode of ESD protection diode 66 with the trigger circuit 80, the buffer circuit 52, the receiver circuits 64, and the power clamp 70. The metallization may further define a wiring path coupling the second power pad 58 with the local interconnect wiring for the negative power supply rail 60, which electrically couples the trigger circuit 80, the buffer circuit 52, the receiver circuits 64, and the power clamp 70.

The I/O pad 62 and power pads 54, 58 may be fabricated using BEOL processes, such as layer deposition, photolithography and subtractive etching understood by a person having ordinary skill in the art. For example, the I/O pad 62 and power pads 54, 58 may be fabricated by depositing a layer stack including a top layer of aluminum (Al), copper (Cu), or an alloy (e.g., AlCu) onto the topmost level of the interconnect wiring and shaping the layer stack with one or more photolithography and etching processes.

The interconnect structure may also include integrated passive devices, such as the resistor 102 and the capacitor 104. These types of passive devices are fabricated during the fabrication of the interconnect structure by fabrication methods familiar to a person having ordinary skill in the art.

In operation, the first power pad 54 may be coupled to a positive chip supply voltage, such as $V_{DD}$, and the second power pad 58 may be coupled to a negative chip supply voltage, such as ground or $V_{SS}$. Shortly after power is applied to the chip, the capacitor 104 may become sufficiently charged through resistor 102 so that the RC node 106 is at voltage approximately equal to $V_{DD}$. This may result in the input 100 of inverter 82 being at approximately the same voltage level as the source of PFET 90, so that the gate-to-source voltage ($V_{GS}$) of PFET 90 is approximately zero. $V_{GS}$ may thereby be less than the threshold voltage ($V_{TH}$) of PFET 90, so that PFET 90 of second inverter 82 is in a high impedance state commonly referred to as a cutoff condition. Thus, little or no current may flow between the source and drain of the PFET 90 of second inverter 82. In contrast, the $V_{GS}$ of NFET 92 may be a positive voltage approximately equal to the difference between $V_{DD}$ and $V_{SS}$, which may be above the $V_{TH}$ of NFET 92. The NFET 92 of second inverter 82 may thereby be in a low impedance state commonly referred to as a saturation condition, which may electrically couple the second output 98 of trigger circuit 80 to the negative power supply rail 60. The second output 98 of the trigger circuit 80 may thereby be pulled by the NFET 92 of second inverter 82 to the voltage of the negative power supply rail 60, so that the trigger signal 109 has a voltage approximately equal to $V_{SS}$.

The voltage level on the second output 98 of trigger circuit 80 may result in the PFET 86 of first inverter 81 having a negative $V_{GS}$ approximately equal to the difference between $V_{SS}$ and $V_{DD}$, so that the PFET 86 of first inverter 81 is saturated, and the NFET 88 of first inverter 81 having a $V_{GS}$ approximately equal to zero volts, so that the NFET 88 of first inverter 81 is cut off. The first output 94 of trigger circuit 80 may therefore be coupled to the positive power supply rail 56 so that the trigger signal 108 is at or near $V_{DD}$. Thus, under normal operating conditions, the voltage of trigger signal 108 will be approximately equal to that of the positive chip supply voltage connected to first power pad 54, and the voltage of trigger signal 109 will be approximately equal to that of the negative chip supply voltage connected to second power pad 58. The trigger signal 108 may thereby bias the gate of protection NFET 72 to approximately $V_{DD}$ so that the protection NFET 72 is saturated, which may electrically couple the source of buffer circuit NFET 75 to the negative power supply rail 60. The trigger circuit 80 may thus allow the buffer circuit 52 to operate normally when the integrated circuit 50 is powered. Because the protection NFET 72 is maintained in a generally static condition while the integrated circuit 50 is powered, the switching speed of protection NFET 72 may not be critical to the operation of the integrated circuit 50. Thus, the protection NFET 72 may be a thick oxide FET or other type of field-effect transistor having a greater gate dielectric breakdown voltage than the buffer circuit NFET 75 without harming the high speed performance of the buffer circuit 52.

In an unpowered state, such as when the chip is not installed on a circuit board or is installed in a circuit board that is not powered, the voltages on power pads 54, 58 may be nominally zero, since any voltages previously applied to the chip tend to bleed off over time. The capacitor 104 may therefore be fully discharged, so that the input 100 of inverter 82 is at zero volts relative to the positive and negative power supply rails 56, 60. Under these conditions, a positive voltage ESD event on the I/O pad 62 may cause the ESD protection diode 66 to become forward biased. In response to the resulting current through ESD protection diode 66, the voltage on the positive power supply rail 56 may rise significantly relative to the negative power supply rail 60 until the voltage difference between the power supply rails is limited by the power clamp 70.

Because the response of the RC node 106 to changes in the voltage on the positive power supply rail 56 may be delayed by an RC time constant formed between resistor 102 and capacitor 104, the voltage at the RC node 106 may remain near zero relative to the negative power supply rail 60 during the ESD event. The input 100 of inverter 82 may therefore initially be at low voltage level relative to the positive supply rail 56. This may result in a negative $V_{GS}$ on the PFET 90 of second inverter 82, so that the PFET 90 becomes saturated. The PFET 90 of second inverter may thereby electrically couple the positive power supply rail 56 to the second output 98 of trigger circuit 80. The voltage at the RC node 106 may also result in the $V_{GS}$ of NFET 92 being approximately zero, so that the NFET 92 of second inverter 82 remains in a cutoff condition. The second output 98 of trigger circuit 80 may thereby have a positive voltage approximately equal to the voltage on the positive power supply rail 56. The trigger signal 109 may thus be at a voltage approximately equal to the voltage present on the I/O pad 62 minus the voltage drop across the forward biased ESD protection diode 66, thereby providing a positive voltage to the input 96 of inverter 81. The $V_{GS}$ of NFET 88 may thereby be sufficiently positive to saturate the NFET 88 of first inverter 81, and the $V_{GS}$ of PFET 86 may be approximately zero, so that the PFET 86 of first inverter 81 is cut off. The first output 94 of trigger circuit 80 may thereby be at or near zero volts relative to the negative power supply rail 60 so that the trigger signal 108 is at a voltage approximately equal to that present on the second power pad 58. The trigger signal 108 may thereby drive the protection NFET 72 into the cut off condition, electrically isolating the source of the buffer circuit NFET 75 from the negative power supply rail 60.

Using the reference numerals presented in FIGS. 1A and 1B with regard to field-effect transistor 10 to refer to like features of buffer circuit NFET 75, the protection NFET 72 may electrically isolate the source contact node 44 of buffer circuit NFET 75 from the negative power supply rail 60 when the protection NFET 72 is in a cutoff condition. Thus, the source contact node 44 of buffer circuit NFET 75 may be electrically isolated from the negative power supply rail 60 by the protection NFET 75 in response to a positive voltage ESD event on I/O pad 62 while the integrated circuit 50 is unpowered. The source contact node 44 of buffer circuit NFET 75 may thereby be effectively floating with respect to the gate contact node 36, so that the impedance of the current path between the gate and source contact nodes 36, 44 is dominated by the series resistance introduced by the protection NFET 72. The voltage drop across $C_{GS}$ 34 of buffer circuit NFET 75 may be reduced by the voltage drop across the protection NFET 72, which may lower the electric field across the gate dielectric of buffer circuit NFET 75 as compared to an integrated circuit 50 lacking the protection NFET 72. The protection NFET 72 may thereby allow the protected NFET 75 to withstand higher ESD voltages on the I/O pad 62 without incurring damage to the gate dielectric layer 22 of buffer circuit NFET 75. The improved ESD resistance of buffer circuit NFET 75 may provide a larger ESD design window within which power clamp 70 may operate.

Figure 4:
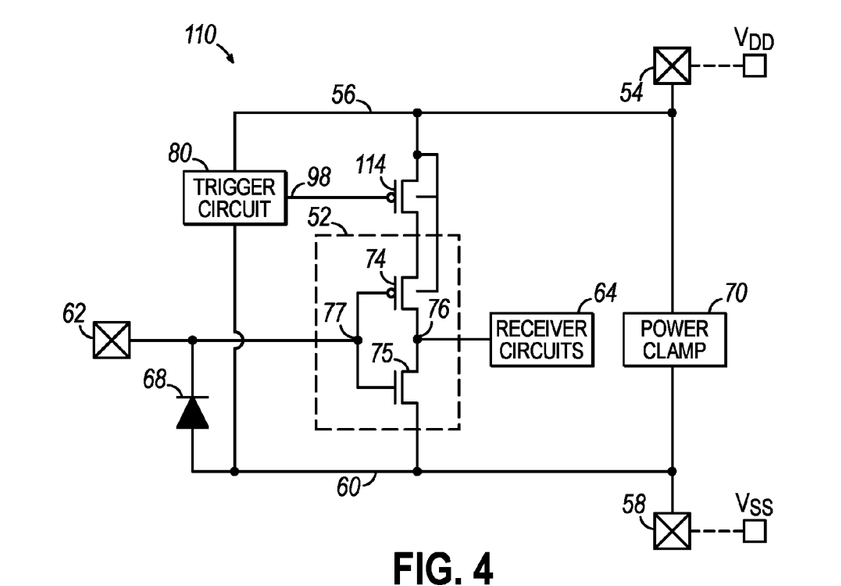
FIG. 4 is a schematic view illustrating the electrical configuration of an ESD protection circuit used to provide protection to an input buffer against negative voltage ESD events to an I/O signal pad coupled with an I/O pin in accordance with an embodiment of the invention.

With reference to FIG. 4 in which like reference numerals refer to like features in FIGS. 2, 3 and in accordance with an embodiment of the invention, an integrated circuit 110 includes buffer circuit 52, first power pad 54, second power pad 58, I/O pad 62, receiver circuits 64, a negative ESD protection diode 68, power clamp 70, trigger circuit 80, and a protection PFET 114. The components of integrated circuit 110 are similar to the integrated circuit 50 illustrated in FIG. 2. However, the source of NFET 75 is coupled to the negative power supply rail 60 instead of the drain of protection NFET 72, and the source of PFET 74 is coupled to the drain of protection PFET 114 instead of the positive power supply rail 56. The PFET 74 of buffer circuit 52 may thereby be selectively coupled to the positive power supply rail 56 by the protection PFET 114. The I/O pad 62 may also be protected from negative ESD events by the negative ESD protection diode 68. The cathode of negative ESD protection diode 68 may be coupled to the I/O pad 62, and the anode of protection diode may be coupled to the negative power supply rail 60. In all other aspects, the structure and operation of integrated circuit 110 is essentially the same as previously described with respect to integrated circuit 50.

The protection PFET 114 may have a source coupled to the positive power supply rail 56 and a gate coupled to the second output 98 of trigger circuit 80. In operation, the first power pad 54 may be coupled to a positive chip supply voltage, such as $V_{DD}$, and the second power pad 58 may be coupled to a negative chip supply voltage, such as ground or $V_{SS}$. As previously described with respect to FIGS. 2 and 3, shortly after power is applied to the integrated circuit 110, the voltage on the second output 98 of trigger circuit 80 may be approximately equal to the voltage on the negative power supply rail 60. Thus, under normal operating conditions, the trigger signal 109 may have a voltage approximately equal to that of the negative chip supply voltage connected to the second power pad 58. By biasing the gate of protection PFET 114 to approximately $V_{SS}$, the trigger circuit 80 may cause the protection PFET 114 to become saturated. The protection PFET 114 may thereby electrically couple the source of buffer circuit PFET 74 to the positive power supply rail 56, allowing the buffer circuit 52 to operate normally when the integrated circuit 110 is powered. As with protection NFET 72, because the protection PFET 114 is maintained in a generally static condition while the integrated circuit 50 is powered, the switching speed of protection PFET 114 may not be critical to the operation of the integrated circuit 50. Thus, the protection PFET 114 may be a thick oxide field effect transistor or other type of field effect transistor having a greater gate dielectric breakdown voltage than the protected PFET 74 without harming the high speed performance of the buffer circuit 52.

In an unpowered state, such as when the integrated circuit 110 is not installed on a circuit board or is installed in a circuit board that is not powered, the voltages on power pads 54, 58 may be nominally zero, since any voltages previously applied to the chip tend to bleed off over time. The capacitor 104 may therefore be fully discharged, so that the input 100 of inverter 82 is at zero volts relative to the power supply rails 56, 60. During a negative voltage ESD event on the I/O pad 62, the ESD protection diode 68 may become forward biased, so that current flows from the negative power supply rail 60 through the negative ESD protection diode 68 to the I/O pad 62. As a result of this outward current flow, the voltage on the negative power supply rail 60 may fall significantly relative to the voltage on the positive power supply rail 56 until the voltage difference between the power supply rails is limited by the power clamp 70.

Because the response of the RC node 106 to changes in voltage on the positive power supply rail 56 may be delayed by the RC time constant formed between resistor 102 and capacitor 104, the voltage across capacitor 104 may remain near zero relative to the negative power supply rail 60 during the negative voltage ESD event. The voltage at the RC node 106 may therefore track the voltage on the negative power supply rail 60 and drop below the voltage on the positive power supply rail 56. The input 100 of inverter 82 may therefore be at a lower voltage than the positive power supply rail 56, so that the PFET 90 of second inverter 82 has a negative $V_{GS}$. The PFET 90 of second inverter 82 may thus become saturated, which may electrically couple the positive power supply rail 56 to the second output 98 of trigger circuit 80. The voltage at the RC node 106 may also result in a $V_{GS}$ of approximately zero volts on the NFET 92 of second inverter 82 so that the NFET 92 remains in a cutoff condition. The second output 98 of trigger circuit 80 may thereby have a voltage approximately equal to the voltage on the positive power supply rail 56. The $V_{GS}$ of protection PFET 114 may thus be approximately zero volts, cutting off the protection PFET 144 and electrically isolating the source of PFET 74 from the positive power supply rail 56 during the negative voltage ESD event.

Similarly as described with respect to the buffer circuit NFET 75 in FIG. 2, and using the reference numerals presented in FIGS. 1A and 1B for field-effect transistor 10 to refer to like features of PFET 74, the protection PFET 114 may isolate the source contact node 44 of buffer circuit PFET 74 from the positive power supply rail 56 in response to the negative voltage ESD event while the integrated circuit 110 is unpowered. The source contact node 44 of PFET 74 may thereby be effectively floating with respect to the gate contact node 36, so that the impedance of the current path between the gate and source contact nodes 36, 44 is dominated by the series resistance introduced by the protection PFET 114. In essentially the same manner as previously described with regard to the buffer circuit NFET 75, the voltage drop across the $C_{GS}$ 34 of PFET 74 may be reduced by the voltage drop across the protection PFET 114, which may lower the electric field across the gate dielectric of PFET 74 as compared to an integrated circuit 110 lacking the protection PFET 114. The protection PFET 114 may thereby allow the buffer circuit PFET 74 to withstand higher ESD voltages on the I/O pad 62 without incurring damage to the gate dielectric layer 22 of buffer circuit PFET 74. Similarly as described with respect to FIG. 2, the improved ESD resistance of PFET 74 may provide a larger ESD design window within which power clamp 70 may operate.

Figure 5:
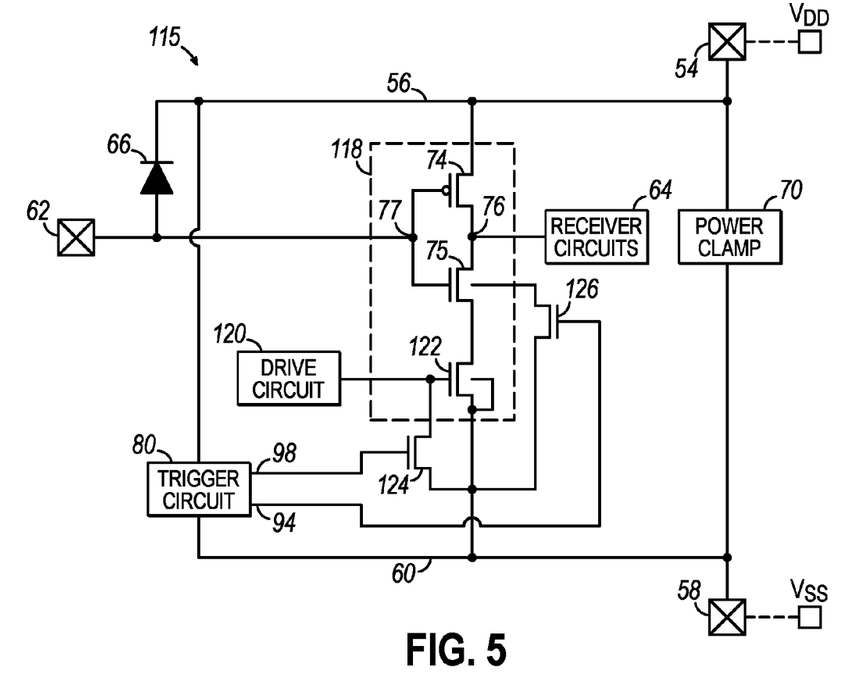
FIG. 5 is a schematic view illustrating the electrical configuration of an ESD protection circuit used to provide protection to an input buffer against positive voltage ESD events to an I/O signal pad coupled with an I/O pin in accordance with an embodiment of the invention.

With reference to FIG. 5 in which like reference numerals refer to like features in FIGS. 2-4 and in accordance with an embodiment of the invention, an integrated circuit 115 includes first power pad 54, second power pad 58, I/O pad 62, receiver circuits 64, positive ESD protection diode 66, power clamp 70, trigger circuit 80, a buffer circuit 118, a drive circuit 120, a first protection NFET 124, and a second protection NFET 126. The components of integrated circuit 115 are similar to the integrated circuit 50 illustrated in FIG. 2. However, the buffer circuit 118 of integrated circuit 115 includes a second NFET 122 with a gate coupled to the drive circuit 120 and connecting the source of buffer circuit NFET 75 to the negative power supply rail 60. The second NFET 122 of buffer circuit 118 may thereby allow the drive circuit 120 to affect the signal on the output 76 of buffer circuit 118. The integrated circuit 115 also includes the first protection NFET 124 connecting the gate of buffer circuit NFET 122 to the negative power supply rail 60, and the second protection NFET 126 connecting the body of buffer circuit NFET 75 to the negative power supply rail 60. In all other aspects, the structure and operation of integrated circuit 115 is essentially the same as previously described with respect to integrated circuit 50.

The first protection NFET 124 may have a drain coupled to the gate of second buffer circuit NFET 122, a source coupled to the negative power supply rail 60, and a gate coupled to the second output 98 of trigger circuit 80. The first protection NFET 124 may thereby be configured to selectively couple the gate of the second buffer circuit NFET 122 to the negative power supply rail 60 in response to trigger signal 109. The second protection NFET 126 may have a drain coupled to the body of buffer circuit of NFET 75, a source coupled to the negative power supply rail 60, and a gate coupled to the first output 94 of trigger circuit 80. The second protection NFET 126 may thereby be configured to selectively couple the body of buffer circuit NFET 75 to the negative power supply rail 60 in response to trigger signal 108.

In operation, the first power pad 54 may be coupled to a positive chip supply voltage, such as $V_{DD}$, and the second power pad 58 may be coupled to a negative chip supply voltage, such as ground or $V_{SS}$. As previously described with respect to FIGS. 2-4, shortly after power is applied to the integrated circuit 115, the voltage on the second output 98 of trigger circuit 80 may be approximately equal to the voltage on the negative power supply rail 60, and the voltage on the first output 94 of trigger circuit 80 may be approximately equal to the voltage on the positive power supply rail 56. Thus, under normal operating conditions, the voltage of trigger signal 108 will be approximately equal to the positive supply voltage provided to first power pad 54, and the voltage of trigger signal 109 will be approximately equal to the negative supply voltage provided to second power pad 58. The trigger signal 109 may thereby bias the gate of the first protection NFET 124 to approximately $V_{SS}$ so that the first protection NFET 124 is cut off, isolating the gate of the second buffer circuit NFET 122 from the negative power supply rail 60. Similarly, the trigger signal 108 may bias the gate of the second protection NFET 126 to approximately $V_{DD}$ so that the second protection NFET 126 is saturated, electrically coupling the body of buffer circuit NFET 75 to the negative power supply rail 60. The trigger circuit 80 may thus allow the buffer circuit 118 to respond normally to signals from the drive circuit 120 and I/O pad 62 when the integrated circuit 115 is powered. Because the protection NFETs 124, 126 are maintained in a generally static condition while the integrated circuit 115 is powered, the switching speed of the protection NFETs 124, 126 may not be critical to the operation of the integrated circuit 115. Thus, the protection NFETs 124, 126 may be thick oxide FETs or other type of field effect transistor having a greater gate dielectric breakdown voltage than the buffer circuit NFET 75 without harming the high speed performance of the buffer circuit 118.

In an unpowered state, such as when the integrated circuit 115 is not installed on a circuit board or is installed on a circuit board that is not powered, the voltages on power pads 54, 58 may be nominally zero, since any voltages previously applied to the chip tend to bleed off over time. The capacitor 104 may therefore be fully discharged, so that the input 100 of inverter 82 is at zero volts relative to the power supply rails 56, 60. During a positive voltage ESD event on the I/O pad 62, the ESD protection diode 66 may become forward biased, so that current flows from the I/O pad 62 through the positive ESD protection diode 66 to the positive power supply rail 56. As a result of this inward current flow, the voltage on the positive power supply rail 56 may rise significantly relative to the voltage on the negative power supply rail 60 until the voltage difference is limited by the power clamp 70.

Because the response of the RC node 106 to changes in voltage on the positive power supply rail 56 may be delayed by the RC time constant formed between resistor 102 and capacitor 104, the voltage across capacitor 104 may remain near zero relative to the negative power supply rail 60 during the positive voltage ESD event. As previously discussed with respect to FIGS. 2-3, the voltage of the RC node 106 may cause the second output 98 of trigger circuit 80 to have a voltage approximately equal to the voltage on the positive power supply rail 56. The $V_{GS}$ of protection NFET 124 may thus be positive, saturating the protection NFET 124 and electrically coupling the gate of the second buffer circuit NFET 122 to the negative power supply rail 60 during a positive voltage ESD event. Likewise, the first output 94 of trigger circuit 80 may provide a voltage approximately equal to the voltage on the negative power supply rail 60 to the gate of the second protection NFET 126. The first output 94 of trigger circuit may thus cause the $V_{GS}$ of the second protection NFET 126 to be approximately zero volts. The second protection NFET 126 may therefore be in a cutoff condition, which may electrically isolate the body of buffer circuit NFET 75 from the negative power supply rail 60.

Using the reference numerals presented in FIGS. 1A and 1B for field-effect transistor 10 to refer to like features of NFET 75, in response to the positive voltage ESD event while the integrated circuit 115 is unpowered, the protection NFET 124 may cause the second buffer circuit NFET 122 to isolate the source contact node 44 of buffer circuit NFET 75 from the negative power supply rail 60. The source contact node 44 of buffer circuit NFET 75 may thereby be effectively floating with respect to the gate contact node 36 of buffer circuit NFET 75. The impedance of the ESD current path between the gate and source contact nodes 36, 44 of buffer circuit NFET 75 may therefore be dominated by the series resistance introduced by the second buffer circuit NFET 122. The voltage drop across the $C_{GS}$ 34 of NFET 75 may thereby be reduced by the voltage drop across the second buffer circuit NFET 122, which may lower the electric field across the gate dielectric of buffer circuit NFET 75 as compared to an integrated circuit 115 lacking the first protection NFET 124.

Similarly, the second protection NFET 126 may isolate the body contact node 49 of buffer circuit NFET 75 from the negative power supply rail 60. The body contact node 49 of buffer circuit NFET 75 may thereby be effectively floating with respect to the gate contact node 36 of buffer circuit NFET 75. The impedance of the ESD current path between the gate and body contact nodes 36, 49 of buffer circuit NFET 75 may therefore be dominated by the series resistance introduced by the second protection NFET 126. The voltage drop across the $C_{GB}$ 34 of buffer circuit NFET 75 may thereby be reduced by the voltage drop across the second protection NFET 126. This reduction may lower the electric field across the gate dielectric layer 22 between the gate 18 and channel 20 of buffer circuit NFET 75 as compared to an integrated circuit 115 lacking the second protection NFET 126.

The protection NFETs 122, 126 may thereby increase the series resistance of the ESD current paths through gate node 36 of buffer circuit NFET 75 by isolating the source and body contact nodes 44, 49 of buffer circuit NFET 75 from the negative power supply rail 60. Isolating the source and body of buffer circuit NFET 75 from the negative power supply rail 60 may thus improve the ability of the gate dielectric layer 22 of buffer circuit NFET 75 to withstand ESD events on I/O pad 62 by reducing the electric field strength across the gate dielectric layer 22 of buffer circuit NFET 75. Similarly as described with respect to FIG. 2, the improved ESD resistance of buffer circuit NFET 75 may provide a larger ESD design window within which power clamp 70 may operate.

Figure 6:
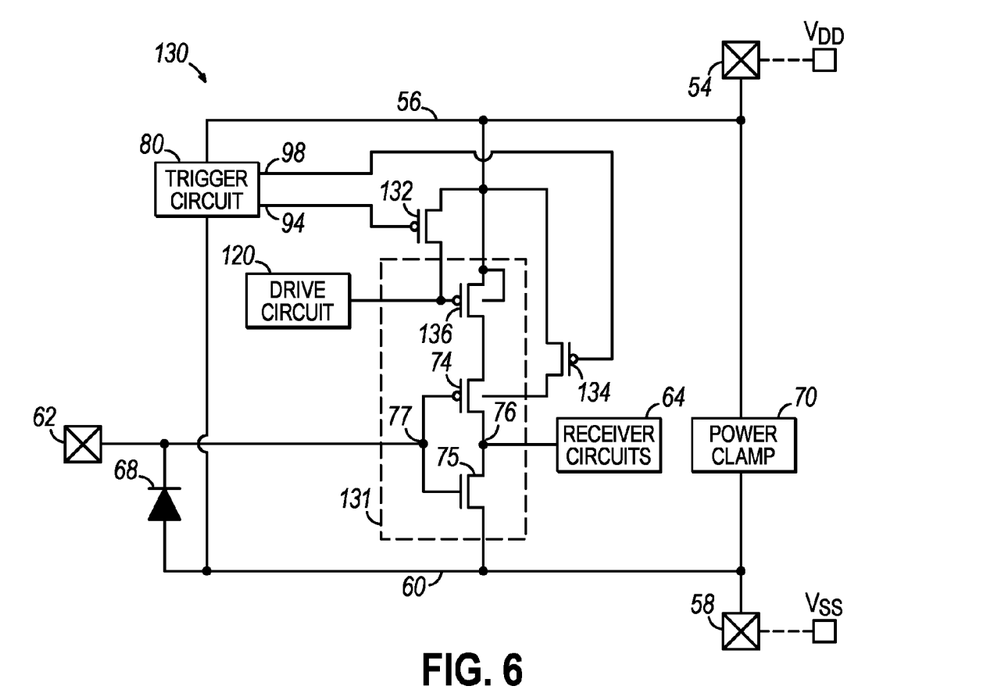
FIG. 6 is a schematic view illustrating the electrical configuration of an ESD protection circuit used to provide protection to an input buffer against positive and negative voltage ESD events to an I/O signal pad coupled with an I/O pin in accordance with an embodiment of the invention.

With reference to FIG. 6 in which like reference numerals refer to like features in FIGS. 2-5 and in accordance with an embodiment of the invention, an integrated circuit 130 includes first power pad 54, second power pad 58, I/O pad 62, receiver circuits 64, negative ESD protection diode 68, power clamp 70, trigger circuit 80, driver circuit 120, a buffer circuit 131, a first protection PFET 132, and a second protection PFET 134. The components of integrated circuit 130 are similar to the integrated circuit 110 illustrated in FIG. 4. However, the buffer circuit 131 of integrated circuit 130 includes a second buffer circuit PFET 136 with a gate coupled to the drive circuit 120 and connecting the source of buffer circuit PFET 74 to the positive power supply rail 56. The second buffer circuit PFET 136 may thereby allow the drive circuit 120 to affect the signal on the output 76 of the buffer circuit 131. The integrated circuit 130 also includes the first protection PFET 132 connecting the gate of second buffer circuit PFET 136 to the positive power supply rail 56 and the second protection PFET 134 connecting the body of buffer circuit PFET 74 to the positive power supply rail 56. In all other aspects, the structure and operation of integrated circuit 130 is essentially the same as previously described with respect to integrated circuit 110.

The first protection PFET 132 may have a drain coupled to the gate of second buffer circuit PFET 136, a source coupled to the positive power supply rail 56, and a gate coupled to a first output 94 of trigger circuit 80. The first protection PFET 132 may thereby be configured to selectively couple the gate of second buffer circuit PFET 136 to the positive power supply rail 56. The second protection PFET 134 may have a drain coupled to the body of buffer circuit PFET 74, a source coupled to the positive power supply rail 56, and a gate coupled to a second output 98 of trigger circuit 80. The second protection NFET 134 may thereby be configured to selectively couple the body of buffer circuit PFET 74 to the positive power supply rail 56.

In operation, first power pad 54 may be coupled to a positive chip supply voltage, such as $V_{DD}$, and second power pad 58 may be coupled to a negative chip supply voltage, such as ground or $V_{SS}$. Similarly as described with respect to FIGS. 2-5, shortly after power is applied to the integrated circuit 130, the first output 94 of trigger circuit 80 may have a voltage approximately equal to the voltage of the positive power supply rail 56, and the second output 98 of the trigger circuit 80 may have a voltage approximately equal to the voltage of the negative power supply rail 60. Thus, under normal operating conditions, the voltage of trigger signal 108 will be approximately equal to the positive supply voltage provided to the first power pad 54, and the voltage of trigger signal 109 will be approximately equal to that of the negative supply voltage provided to the second power pad 58. The trigger signal 108 may thereby bias the gate of first protection PFET 132 to approximately $V_{DD}$ so that the first protection PFET 132 is cut off, isolating the gate of the second buffer PFET 136 from the positive power supply rail. Likewise, the trigger signal 109 may bias the gate of second protection PFET 134 to approximately $V_{SS}$ so that the second protection PFET 134 is saturated, electrically coupling the body of buffer circuit PFET 74 to the positive power supply rail 56. The trigger circuit 80 may thus allow the buffer circuit 52 to respond normally to signals from the drive circuit 120 and I/O pad 62 when the integrated circuit 130 is powered. Because the protection PFETs 132, 134 are maintained in a generally static condition while the integrated circuit 130 is powered, the switching speed of the protection PFETs 132, 134 may not be critical to the operation of the integrated circuit 130. Thus, the protection PFETs 132, 134 may be thick oxide FETs or other type of field effect transistor having a greater gate dielectric breakdown voltage than the buffer circuit PFET 74 without harming the high speed performance of the buffer circuit 131.

In an unpowered state, such as when the integrated circuit 130 is not installed on a circuit board or is installed on a circuit board that is not powered, the voltages on power pads 54, 58 may be nominally zero, since any voltages previously applied to the chip tend to bleed off over time. The capacitor 104 may therefore be fully discharged, so that the input 100 of second inverter 82 is at zero volts relative to the power supply rails 56, 60. During a negative voltage ESD event on the I/O pad 62, the ESD protection diode 68 may become forward biased, so that current flows from the negative power supply rail 60 through the ESD protection diode 68 to the I/O pad 62. As a result of this outward current flow, the voltage on the negative power supply rail 60 may drop significantly relative to the voltage on the positive power supply rail 56 until the voltage difference is limited by the power clamp 70.

Because the response of the RC node 106 to changes in voltage on the positive power supply rail 56 may be delayed by the RC time constant formed between resistor 102 and capacitor 104, the voltage across capacitor 104 may remain near zero relative to the negative power supply rail 60 during the negative voltage ESD event. The voltage at the RC node 106 may therefore track the voltage on the negative power supply rail 60 and drop below the voltage on the positive power supply rail 56. As previously discussed with respect to FIGS. 2 and 4, the voltage at the RC node 106 may cause the second output 98 of trigger circuit 80 to have a voltage approximately equal to the voltage on the positive power supply rail 56. The $V_{GS}$ of protection PFET 134 may thus be approximately zero, cutting off the protection PFET 134 and electrically isolating the body of buffer circuit PFET 74 from the positive power supply rail 56 during the negative voltage ESD event. Similarly, the first output 94 of trigger circuit 80 may provide a voltage approximately equal to the voltage on the negative power supply rail 60 to the gate of protection PFET 132. The first output 94 of trigger circuit may thus cause the $V_{GS}$ of the first protection PFET 132 to be sufficiently negative to saturate the first protection PFET 132. The first protection PFET 132 may thereby electrically couple the gate of second buffer circuit PFET 136 to the positive power supply rail 56 so that the second buffer circuit PFET 136 is in a cutoff condition, isolating the source of second buffer circuit PFET 74 from the positive power supply rail 56.

Using the reference numerals presented in FIGS. 1A and 1B for field-effect transistor 10 to refer to like features of PFET 74, in response to the negative voltage ESD event while the integrated circuit 130 is unpowered, the protection PFET 132 may cause the second buffer circuit PFET 136 to isolate the source contact node 44 of buffer circuit PFET 74 from the positive power supply rail 56. The source contact node 44 of buffer circuit PFET 74 may thereby be effectively floating with respect to the gate contact node 36 of buffer circuit PFET 74, which may cause the impedance of the current path between the gate and source contact nodes 36, 44 of buffer circuit PFET 74 to be dominated by the series resistance introduced by the second buffer circuit PFET 136. The voltage drop across $C_{GS}$ 34 of PFET 74 may thereby be reduced by the voltage drop across the second buffer circuit PFET 136, which may lower the electric field across the gate dielectric of buffer circuit PFET 74 as compared to an integrated circuit 130 lacking the first protection PFET 132.

Similarly, the second protection PFET 134 may isolate the body contact node 49 of buffer circuit PFET 74 from the positive power supply rail 56. The body contact node 49 of buffer circuit PFET 74 may thereby be effectively floating with respect to the gate contact node 36 of buffer circuit PFET 74 in response to the negative voltage ESD event. The impedance of the ESD current path between the gate and body contact nodes 36, 49 of buffer circuit PFET 74 may therefore be dominated by the series resistance introduced by the second protection PFET 134. The voltage drop across the $C_{GB}$ 32 of buffer circuit PFET 74 may thereby be reduced by the voltage drop across the second protection PFET 134. This reduction may lower the electric field across the gate dielectric layer 22 between the gate 18 and channel 20 of buffer circuit PFET 74 as compared to an integrated circuit 130 lacking the second protection PFET 134.

The protection PFETs 132, 134 may thereby increase the series resistances of the ESD current paths through gate node 36 of buffer circuit PFET 74 by isolating the source and body contact nodes 44, 49 of buffer circuit PFET 74 from the positive power supply rail 56. Isolating the source and body of buffer circuit PFET 74 from the positive power supply rail 56 may thus improve the ability of the gate dielectric layer 22 of buffer circuit PFET 74 to withstand ESD events on I/O pad 62 by reducing the electric field strength across the gate dielectric layer 22 of buffer circuit PFET 74. Similarly as described with respect to FIG. 4, the improved ESD resistance of buffer circuit PFET 74 may provide a larger ESD design window within which power clamp 70 may operate.

Figure 7:
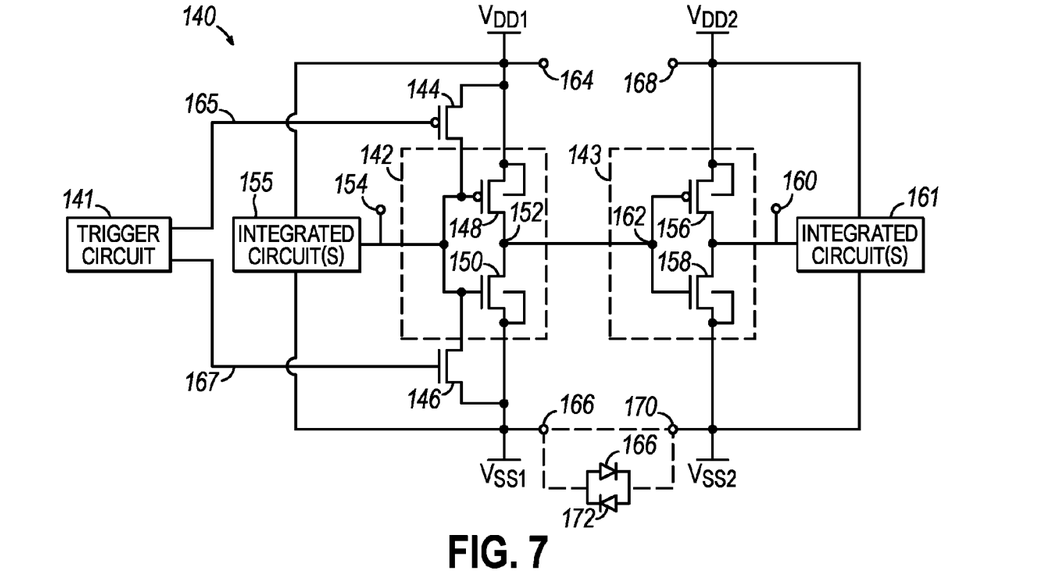
FIG. 7 is a schematic view illustrating the electrical configuration of an ESD protection circuit used to provide protection against cross-domain gate-dielectric breakdown.

With reference to FIG. 7 and in accordance with an embodiment of the invention, an ESD protected voltage level shifting circuit 140 includes a trigger circuit 141, a driver circuit 142 having an input node 154 coupled to integrated circuit(s) 155 operating in a first voltage domain, a receiver circuit 143 having an output node 160 coupled to integrated circuit(s) 161 operating in a second voltage domain, a protection PFET 144, and a protection NFET 146. The driver circuit 142 may be an inverter, which includes a PFET 148 and an NFET 150. The drain of the PFET 148 may be coupled to the drain of NFET 150, which forms a driver circuit output 152. The gate of PFET 148 may be coupled to the gate of NFET 150, which forms the driver circuit input node 154. The integrated circuit(s) 155 operating in the first voltage domain may be supplied with power from a first positive power supply rail or node 164 having a potential of $V_{DD1}$ and a first negative power supply rail or node 166 at a first ground potential or $V_{SS1}$. So that the input node 154 of driver circuit 142 is compatible with signals originating from the integrated circuit(s) 155, the driver circuit 142 may be coupled to the positive power supply node 164 by the source of PFET 148 and to the negative power supply node 166 by the source of NFET 150.

Similarly, the receiver circuit 143 may be an inverter, which includes a PFET 156 and an NFET 158. The drain of PFET 156 may be coupled to the drain of NFET 158 to form the receiver circuit output node 160. The gate of PFET 156 may be coupled to the gate of NFET 158, which forms a receiver circuit input 162 that is coupled to the output 152 of driver circuit 142. The integrated circuit(s) 161 operating in the second voltage domain may be supplied with power from a second positive power supply rail or node 168 having a potential of $V_{DD2}$ and a second negative power supply rail or node 170 at a second ground potential or $V_{SS2}$. To prevent the first and second voltage domains from floating relative to each other, the first negative power supply node 166 may be coupled to the second negative power supply node 170 directly or—to improve noise isolation between the integrated circuits 155, 161—by diodes 172, 174. To achieve compatibility between the output voltages of the receiver circuit 143 and the inputs of the integrated circuit(s) 161, the receiver circuit 143 may be coupled to $V_{DD2}$ by the source of PFET 156 and to $V_{SS2}$ by the source of NFET 158. The driver and receiver circuits 142, 143 may thereby provide cross-domain voltage translation between the integrated circuits 155, 161 operating with different power supply voltages.

The protection PFET 144 may have a source coupled to the positive power supply node 164, a gate coupled to a first output 165 of trigger circuit 141, and a drain coupled to the gate of driver circuit PFET 148. The protection NFET 146 may have a source coupled to the negative power supply node 166, a gate coupled to a second output 167 of trigger circuit 141, and a drain coupled to the gate of driver circuit NFET 150. The trigger circuit 141 may include an RC-trigger circuit similar to the trigger circuit 80 shown in FIG. 3 and may be coupled to one or more of the positive and negative power supply nodes 164, 166, 168, 170. Similarly as described with respect to trigger circuit 80, when the integrated circuit(s) 155 is powered, the first output 165 of trigger circuit 141 may bias the gate of PFET 144 to a voltage approximately equal to $V_{DD1}$, which may cause the $V_{GS}$ of PFET 144 to be approximately zero volts. Likewise, the second output 167 of trigger circuit 141 may bias the gate of protection NFET 146 to a voltage approximately equal to $V_{SS1}$, which may cause the $V_{GS}$ of protection NFET 146 to be approximately zero volts. The protection PFET 144 and the protection NFET 146 may thus be maintained in the cut-off condition, which may isolate the gate of driver circuit PFET 148 from the positive power supply node 164 and the gate of driver circuit NFET 150 from the negative power supply node 166, respectively. The driver circuit 142 may thereby operate normally when the integrated circuit(s) 155 is powered. Because the protection PFET 144 and the protection NFET 146 are maintained in a generally static condition while the integrated circuit 140 is powered, the switching speed of the protection PFET 144 and NFET 146 may not be critical to the operation of the integrated circuit 140. Thus, the protection PFET 144 and NFET 146 may be thick oxide FETs or some other type of field effect transistor having a greater gate dielectric breakdown voltage than the driver circuit NFET 148, driver circuit NFET 150, receiver circuit PFET 156, and receiver circuit NFET 158 without harming the high speed performance of the driver circuit 142.

In an unpowered state, such as when the chip is not installed on a circuit board or is installed on a circuit board that is not powered, the voltages on the power supply nodes 164, 166, 168, 170 may be nominally zero, since any voltages previously applied to the chip tend to bleed off over time. Under these conditions, a positive voltage ESD event on the first positive power supply node 164 may cause the voltage of the first positive power supply node 164 to rise with respect to the second negative power supply node 170. The first output 165 of trigger circuit 141 may be configured to provide a negative $V_{GS}$ to protection PFET 144 in response to a positive voltage ESD event on the first positive power supply node 164. The negative $V_{GS}$ may saturate the protection PFET 144, which may electrically couple the gate of driver circuit PFET 148 to the positive power supply node 164. The trigger circuit 141 may be further configured to output a voltage on the second output 167 of the trigger circuit 141 approximately equal to the voltage on the first negative power supply node 166. The trigger circuit 141 may thereby drive the protection NFET 146 into a cutoff condition so that the first positive power supply node 164 is not shorted to the first negative power supply node 166 though the protection PFET 144 and protection NFET 146.

With the gate and the source of driver circuit PFET 148 coupled to the positive power supply node 164, the $V_{GS}$ of driver circuit PFET 148 may be approximately zero volts. The driver circuit PFET 148 may thus be in a cutoff condition, which may increase the resistance of the ESD current path between the positive power supply node 164 and the negative power supply node 170 passing through the gate of receiver circuit NFET 158. The driver circuit PFET 148 may thereby reduce the voltage drop between the gate and source of the receiver circuit NFET 158 so that the electric field across the gate dielectric of the receiver circuit NFET 158 is reduced. The receiver circuit NFET 158 may thereby be protected from cross-domain gate dielectric breakdown from the positive voltage ESD event on power supply node 164.

Similarly, a positive voltage ESD event on the second positive power supply node 168 may cause the voltage of the power supply node 168 to rise with respect to the first negative power supply node 166. The second output 167 of trigger circuit 141 may be configured to provide a positive $V_{GS}$ to protection NFET 146 in response to a positive voltage ESD event on the second positive power supply node 168. The positive $V_{GS}$ may saturate the protection NFET 146, which may electrically couple the gate of driver circuit NFET 150 to the first negative power supply node 166. The trigger circuit 141 may be further configured to output a voltage on the first output 165 of trigger circuit 141 approximately equal to the voltage on the first positive power supply node 164. The trigger circuit 141 may thereby drive the protection PFET 144 into a cutoff condition so that the first positive power supply node 164 is not shorted to the first negative power supply node 166 though the protection PFET 144 and protection NFET 146.

With the gate and the source of driver circuit NFET 150 coupled to the negative power supply node 166, the $V_{GS}$ of driver circuit NFET 150 may be approximately zero volts. The driver circuit NFET 150 may thus be in a cutoff condition, which may increase the resistance of the ESD current path between the positive power supply node 168 and the negative power supply node 166 passing through the gate of receiver circuit PFET 156. The driver circuit NFET 150 may thereby reduce the voltage drop between the gate and source of the receiver circuit PFET 156 so that the electric field across the gate dielectric of the receiver circuit PFET 156 is reduced. The PFET 156 of receiver circuit 143 may thereby be protected from cross-domain gate dielectric breakdown from the positive voltage ESD event on power supply node 168.

Figure 8:
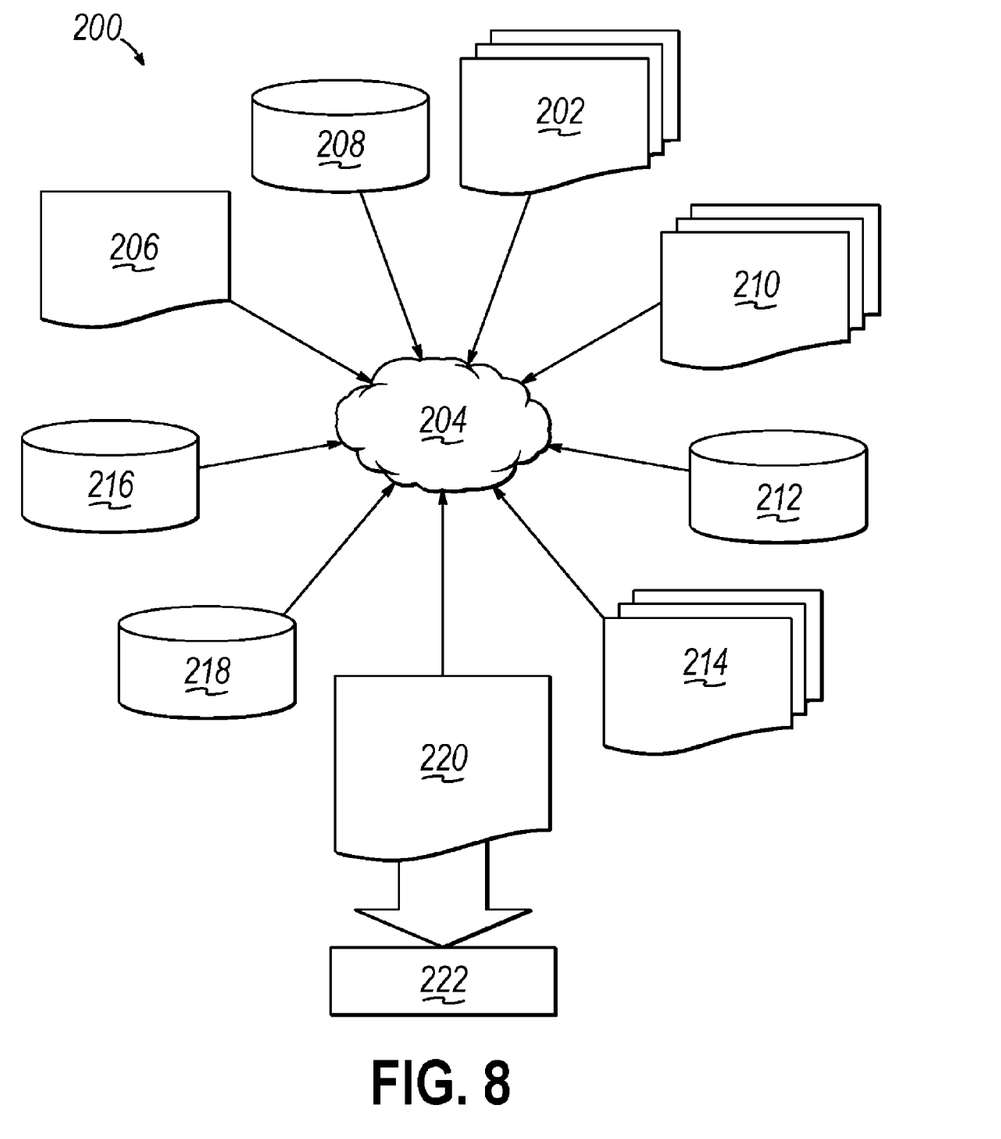
FIG. 8 is a flow diagram of a design process used in semiconductor design, manufacture, and/or test.

FIG. 8 shows a block diagram of an exemplary design flow 200 used for example, in semiconductor IC logic design, simulation, test, layout, and manufacture. Design flow 200 includes processes, machines and/or mechanisms for processing design structures or devices to generate logically or otherwise functionally equivalent representations of the design structures and/or devices described above and shown in FIGS. 2-7. The design structures processed and/or generated by design flow 200 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 200 may vary depending on the type of representation being designed. For example, a design flow 200 for building an application specific IC (ASIC) may differ from a design flow 200 for designing a standard component or from a design flow 200 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 202 that is preferably processed by a design process 204. Design structure 202 may be a logical simulation design structure generated and processed by design process 204 to produce a logically equivalent functional representation of a hardware device. Design structure 202 may also or alternatively comprise data and/or program instructions that when processed by design process 204, generate a functional representation of the physical structure of a hardware device. Whether representing functional and/or structural design features, design structure 202 may be generated using electronic computer-aided design (ECAD) such as implemented by a core developer/designer. When encoded on a machine-readable data transmission, gate array, or storage medium, design structure 202 may be accessed and processed by one or more hardware and/or software modules within design process 204 to simulate or otherwise functionally represent an electronic component, circuit, electronic or logic module, apparatus, device, or system such as those shown in FIGS. 2-7. As such, design structure 202 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 204 preferably employs and incorporates hardware and/or software modules for synthesizing, translating, or otherwise processing a design/simulation functional equivalent of the components, circuits, devices, or logic structures shown in FIGS. 2-7 to generate a Netlist 206 which may contain design structures such as design structure 202. Netlist 206 may comprise, for example, compiled or otherwise processed data structures representing a list of wires, discrete components, logic gates, control circuits, I/O devices, models, etc. that describes the connections to other elements and circuits in an integrated circuit design. Netlist 206 may be synthesized using an iterative process in which netlist 206 is resynthesized one or more times depending on design specifications and parameters for the device. As with other design structure types described herein, netlist 206 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 204 may include hardware and software modules for processing a variety of input data structure types including Netlist 206. Such data structure types may reside, for example, within library elements 208 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 210, characterization data 212, verification data 214, design rules 216, and test data files 218 which may include input test patterns, output test results, and other testing information. Design process 204 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 204 without deviating from the scope and spirit of the invention. Design process 204 may also include modules for performing standard circuit design processes such as timing analysis, verification, design rule checking, place and route operations, etc.

Design process 204 employs and incorporates logic and physical design tools such as HDL compilers and simulation model build tools to process design structure 202 together with some or all of the depicted supporting data structures along with any additional mechanical design or data (if applicable), to generate a second design structure 220. Design structure 220 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 202, design structure 220 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 2-7. In one embodiment, design structure 220 may comprise a compiled, executable HDL simulation model that functionally simulates the devices shown in FIGS. 2-7.

Design structure 220 may also employ a data format used for the exchange of layout data of integrated circuits and/or symbolic data format (e.g. information stored in a GDSII (GDS2), GL1, OASIS, map files, or any other suitable format for storing such design data structures). Design structure 220 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 2-7. Design structure 220 may then proceed to a stage 222 where, for example, design structure 220: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It will be understood that when an element is described as being "connected" or "coupled" to or with another element, it can be directly connected or coupled to the other element or, instead, one or more intervening elements may be present. In contrast, when an element is described as being "directly connected" or "directly coupled" to another element, there are no intervening elements present. When an element is described as being "indirectly connected" or "indirectly coupled" to another element, there is at least one intervening element present.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A circuit for protecting an integrated circuit from an electrostatic discharge (ESD) event, the circuit comprising:

a power supply rail;

an input/output pad;

a buffer circuit comprising a first field-effect transistor with a gate coupled to the input/output pad, a source, a gate dielectric layer, and a body;

a second field-effect transistor including a gate, a drain coupled to the body of the first field-effect transistor, and a source selectively coupled to the power supply rail; and a trigger circuit coupled with the input/output pad and with the gate of the second field-effect transistor, the trigger circuit configured to output a first voltage to the gate of the second field-effect transistor in response to the ESD event at the input/output pad and while the integrated circuit is unpowered, wherein the second field-effect transistor enters a cutoff condition in response to the first voltage at the gate of the second field-effect transistor so that the second field-effect transistor electrically isolates the body of the first field-effect transistor from the power supply rail.

2. The circuit of claim 1 wherein the trigger circuit is further configured to output a second voltage to the gate of the second field-effect transistor in response to the integrated circuit being powered, and the second field-effect transistor enters a saturated condition in response to the second voltage at the gate of the second field effect transistor so that the body of the first field-effect transistor is coupled to the power supply rail.

3. The circuit of claim 1 further comprising:

a third field-effect transistor including a gate coupled to the trigger circuit, a drain coupled to the source of the first field-effect transistor, and a source coupled to the power supply rail, wherein the third field-effect transistor is configured to selectively couple the source of the first field-effect transistor to the power supply rail.

4. The circuit of claim 3 further comprising:

a fourth field-effect transistor having a gate coupled with the trigger circuit, a source coupled to the power supply rail, and a drain coupled to the source of the third field-effect transistor.

5. The circuit of claim 4 wherein the trigger circuit is further configured to output a third voltage in response to the ESD event at the input/output pad, the fourth field-effect transistor enters a saturation condition in response to the third voltage so that the gate of the third field-effect transistor is coupled to the power rail.

6. The circuit of claim 3 further comprising:

a drive circuit coupled with the gate of the third field-effect transistor.

7. The circuit of claim 3 wherein the trigger circuit is further configured to output a third voltage to the gate of the fourth field-effect transistor in response to the integrated circuit being powered, and the fourth field-effect transistor enters a cutoff condition in response to third voltage at the gate of the fourth field effect transistor so that the gate of the first field-effect transistor is isolated from the power supply rail.

8. The circuit of claim 1 wherein the second field-effect transistor has a gate dielectric layer that is thicker than the gate dielectric layer of the first field-effect transistor.

9. The circuit of claim 1 wherein the first field-effect transistor and the second field-effect transistor are n-channel field-effect transistors.

10. The circuit of claim 1 wherein the buffer circuit comprises an inverter that includes the first field-effect transistor.

11. A hardware description language (HDL) design structure encoded on a non-transitory machine-readable data storage medium, the HDL design structure comprising elements that when processed in a computer-aided design system generates a machine-executable representation of a circuit for protecting an integrated circuit during an electrostatic discharge (ESD) event, the HDL design structure comprising:

a power supply rail;

an input/output pad;

a buffer circuit comprising a first field-effect transistor with a gate coupled to the input/output pad, a source, a gate dielectric layer, and a body;

a second field-effect transistor including a gate, a drain coupled to the body of the first field-effect transistor, and a source selectively coupled to the power supply rail; and a trigger circuit coupled with the input/output pad and with the gate of the second field-effect transistor, the trigger circuit configured to output a first voltage to the gate of the second field-effect transistor in response to the ESD event at the input/output pad and while the integrated circuit is unpowered, wherein the second field-effect transistor enters a cutoff condition in response to the first voltage at the gate of the second field-effect transistor so that the second field-effect transistor electrically isolates the body of the first field-effect transistor from the power supply rail.

12. The HDL design structure of claim 11 wherein the HDL design structure comprises a netlist.

13. The HDL design structure of claim 11 wherein the DHL design structure resides on storage medium as a data format used for the exchange of layout data of integrated circuits.

14. The HDL design structure of claim 11 wherein the HDL design structure resides in a programmable gate array.

* * * * *